Dec. 30, 1969 K. M. HAMMELL 3,487,350

MULTIPLE CONTACT MOUNTING WAFER

Filed Aug. 4, 1967

United States Patent Office 3,487,350
Patented Dec. 30, 1969

3,487,350
MULTIPLE CONTACT MOUNTING WAFER

Kemper Martel Hammell, Harrisburg, Pa., assignor to AMP Incorporated, Harrisburg, Pa.

Filed Aug. 4, 1967, Ser. No. 658,408
Int. Cl. H05k *1/00;* H01r *9/08*
U.S. Cl. 339—17 5 Claims

ABSTRACT OF THE DISCLOSURE

A multiple contact mounting wafer is disclosed having a thin insulating body containing a series of apertures with interior dimensions arranged to assure that retaining stresses caused by socket contacts fitted in the wafer are substantially neutralized to prevent wafer distortion. The wafer apertures and the sockets include beveled portions defining together a guiding surface to facilitate insertion of leads in such sockets. The wafer includes a latching structure to temporarily latch the wafer in proper position for further termination relative to a printed circuit board. The wafer includes projecting portions which serve as stand-offs relative to the wafer itself being plugged into a printed circuit board or a component being plugged into the wafer. Certain of these projecting portions facilitate a bonding of the wafer to the printed circuit board, which bonding may be easily severed if it is necessary to remove the wafer from a mother board.

Background of the invention

The problem of providing multiple pluggable connections in miniaturized structures, which is a general one of long standing, is particularly well evidenced in the art of terminating integrated circuits (IC). While this art has made substantial progress toward miniaturizing electronic circuits to the point where dozens of related electronic components are carried on a common substrate smaller in size than that of a single component of a few years ago, the number of leads to and from the circuit has not decreased. Nor has the size of the leads, at least at the end portions, been appreciably diminished. This results in a structure wherein a very small component housing in the form of a can covering over the component carrying substrate, includes a relatively large number of relatively large leads extending therefrom. As a general answer to the problem of terminating IC modules, the art has turned to the use of relatively thick mounting headers which contain contact sockets with downwardly extending pins designed to be fitted into a printed circuit board, frequently termed a mother board, with the individual socket pins terminated to printed circuit paths on the mother board in a suitable fashion as by flow soldering. Another answer to this problem, especially where high packaging density relative to space above the board is required, has not been to use header assemblies, but rather to use miniature spring sockets comprising eyelets of limited diameters and lengths with closed bottoms and open flanged tops with self-contained spring contacts therein. The eyelet bodies of these miniature contact sockets then serve as the extended pins of the header assemblies and can be soldered directly to the under side of the mother board with their flanged openings extending only slightly above the top of the board. Several problems, however, arise. One, the additional cost of individually inserting the plurality of miniature contact sockets in the holes of the mother board. Two, these contact sockets must then be secured to the board prior to soldering to prevent them from being accidentally dropped out during the various handling operations and especially to keep them from floating up and out of the board during the soldering process. It must be remembered that these small closed end eyelets are almost weightless and are quite buoyant on the surface of molten solder. A satisfactory low cost solution to these problems has been to provide a thin mounting wafer-socket extending only slightly above the board and accommodating itself to its contained short miniature contact sockets so that the closed ends of the sockets extend below the bottom of the mother board for optimized soldering and providing a quick self-contained stand-off attachment means on the under side of the wafer socket whereby it may be self-secured to the mother board during the assembly operation, thus preventing misplacement during handling and soldering operation. The IC module is then fitted onto the wafer with the individual leads thereof being plugged into the wafer sockets. One of the problems with this kind of structure is that the leads from the IC module are usually rather soft and easily bendable, making it difficult to maintain the leads in an alignment to permit the module to be easily inserted into the fixed sockets of the wafer. In other words, the various leads which are supposed to be generally parallel in a given pattern related to the pattern of sockets on a wafer do not have sufficiently exact parallel axes. One way to solve this problem, at least in part, is to make each of the sockets contain a resilient contact capable of accommodating slight displacements of the IC module leads. As can be appreciated, the overall restriction on size places a definite limit on the degree of accommodation which can be achieved by providing resilient contacts in the socket. Another problem is that the miniaturization required makes for a wafer structure which is relatively fragile and easily distorted. If the wafer is distorted the socket contacts which are mounted therein will not be in a proper alignment to fit in a corresponding pattern of holes in the printed circuit board. If the holes in the printed circuit board are made relatively large to ease this problem, the sockets may, nevertheless, be out of alignment relative to the leads to be inserted therein. Still another problem is raised by applications calling for a number of IC modules and wafers to be mounted on a common mother board. The problem is one of temporarily holding the wafers in a proper position for flow soldering until the soldering operation permanently affixes the wafers to the mother board. The prior art has turned to mechanically securing the headers to the mother board by means of rivets, screws or the like, prior to a flow soldering operation, but this adds considerably to assembly expense and makes it quite difficult to replace or repair the assembly in the event there is some defect in one of the sockets in a given header or of the header itself. With miniature eyelet contact sockets others have resorted to the practice of taping them into position prior to the flow soldering process. Again this increases the assembly cost considerably.

Summary of the invention

This invention relates to a miniature spring socket mounting wafer providing an improved assembly of electrical or electronic packages and better assuring a reliable use with pluggable electrical and/or electronic components. The invention is particularly adaptable to solving the problem of providing a pluggable mount of integrated circuit modules relative to a system circuit of use.

It is an object to provide a wafer mounting a plurality of miniature spring sockets which better accommodates the plugging in or removal of a component having a relatively large number of leads. It is another object to provide a mounting wafer which minimizes distortion and a resulting misalignment of sockets carried thereby and projecting therefrom. It is still another object to provide a miniature socket mounting wafer which provides in a very simple structure for latching and standoff relative to use with a mother board into which the sockets carried thereby are plugged and terminated.

The foregoing problems are overcome and the foregoing objectives are attained by providing a wafer of insulating material including a thin wall portion through which apertures are made to extend in a pattern to receive a plurality of metallic socket contacts corresponding to the pattern of leads of a component to be plugged therein and to a pattern of apertures in a mother board into which the sockets are to be plugged and terminated. The wafer apertures have an interior configuration relative to the exterior configuration of a given socket to latch the socket in a position so that stresses developed by the force-fit of the socket reside along the center line of the body of the wafer to thus prevent distortion from warping the wafer and causing a misalignment of the projecting sockets. The apertures of the wafer have a beveled surface made to match a beveled surface on the socket to define a funnel-shaped entry guiding a given lead into a proper position for a full insertion within a a socket. In a particular embodiment the wafers are made of a thermoplastic material such as nylon, which has a sufficient give to permit misalignment caused by production or assembly tolerances of the sockets relative to the wafer and relative to the positions of apertures in a mating mother board. The wafer includes a projecting latch structure made to fit within an aperture in the mother board and latch the wafer into proper position for subsequent termination as by flow soldering of the various contacts to various printed circuit paths carried thereon. In one embodiment the wafer includes an upwardly projecting integral portion which serves to hold the component in a proper position relative to the extent of lead insertion within the contacts of the sockets carried by the wafer. A series of small projections or bumps are carried on the under side of the wafer which served as a stand-off defining a clearance between the under side of the wafer and the upper surface of the mating mother board to permit defluxing of the upper surface of the mother board following soldering or other termination procedures. At least one of these projections is of a configuration to facilitate a bonding of the wafer to the mother board, if such is required or desired in a given application, which bonding may be readily severed because of the limited area of engagement with the mother board. In each embodiment there is provided an orienting projection in the general plane of the wafer body which may be used relative to orienting structure on the module or on the mother board, if such is required or desired.

Description of preferred embodiment

Figures 1, 2, 3, 4, 5A, 5B, 5C:
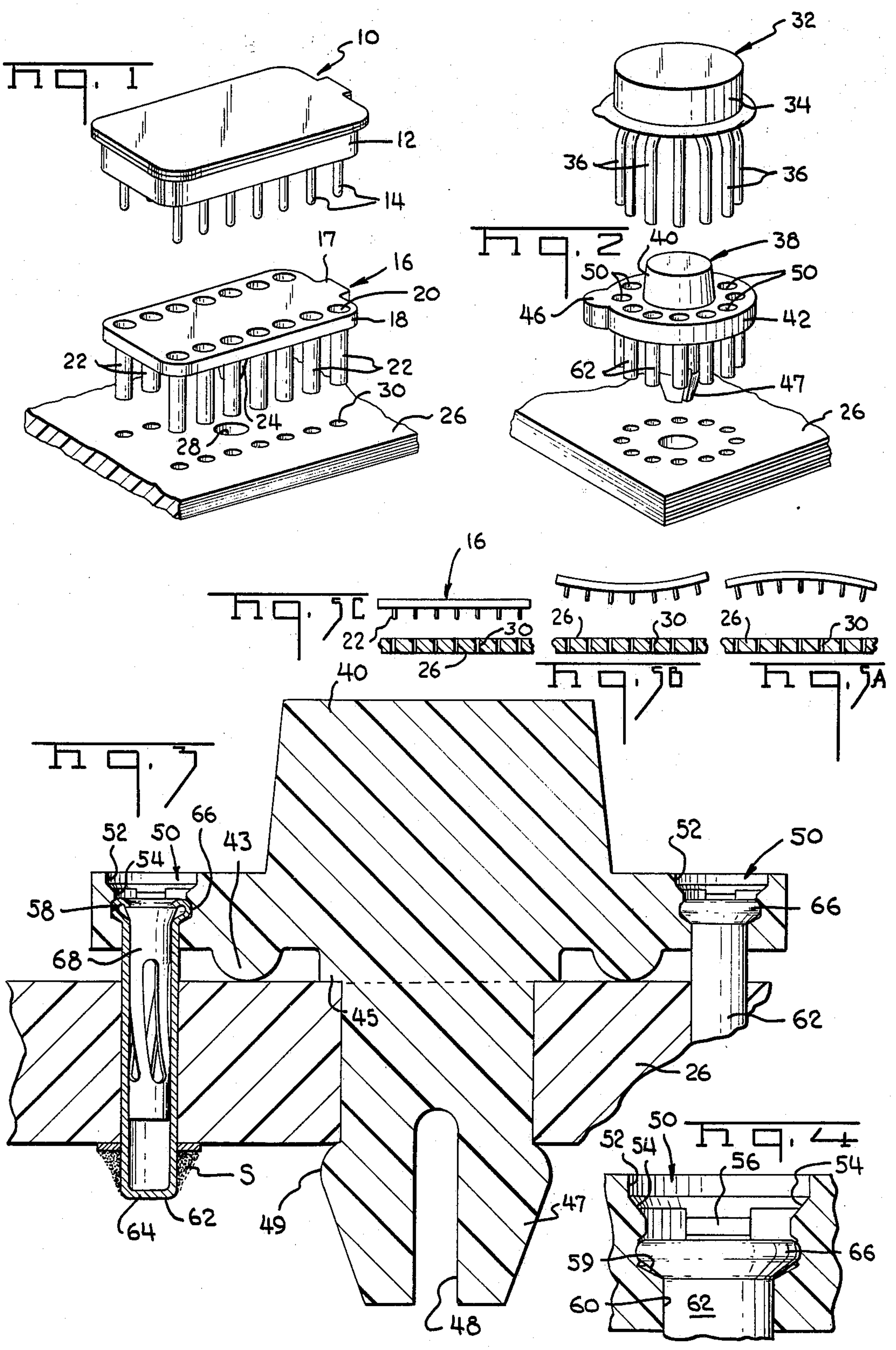
FIGURE 1 is a perspective view of the module wafer and mother board assembly in proper alignment for mating, but unmated relative to one embodiment of the invention.
FIGURE 2 is a view like FIGURE 1, but of an alternative embodiment of the invention.
FIGURE 3 is an enlarged cross-sectional view showing the embodiment of FIGURE 2 mated and terminated.
FIGURE 4 is a sectional view of an enlarged portion of the embodiment of FIGURE 3; and FIGURES *5a*, *5b* and *5c* are schematic diagrams showing one aspect of the misalignment problem solved by the invention.

In FIGURE 1 an integrated circuit module 10 of a typical configuration is shown to include an outer housing 12 of a generally rectangular configuration, including projecting from one side thereof, a series of leads 14 arranged in a pattern forming two rows. The module 10 contains therewithin an integrated circuit with the various circuit paths being terminated to conductive leads made to extend out of the housing, or alternatively terminated to contact pins carried or mounted on the housing. The numeral 14 may thus represent either stripped electrical leads or terminal pins or tips to which the IC circuit paths are terminated within the housing 12. As a general rule, failure of any part of the IC components calls for replacement of the module and it is desirable to be able to plug the module or remove the module from the circuit of use, manually, and without the need for breaking solder bonds, crimps or other permanent type connections. In many instances the housing 12 is, in fact, a can-like structure formed of metal stampings bonded or brazed together after the IC carrying substrate has been placed therein. The circuit paths and leads or terminal pins are insulated from the can and from each other by separate inserts formed of ceramic or glass, which also seals the can against entry of contaminants or out-gassing of components from within the can. If the housing 12 is of metallic construction it is important that the under surface thereof be prevented from touching or lying against conductive material which could short out any part of the circuit.

In FIGURE 1, positioned beneath 10, is an embodiment of the wafer of the invention shown as 16. As can be seen, the overall configuration of the wafer is similar to the configuration of the module 10. There is included at at least one end of the wafer a projecting portion shown as 17, which may be used to key the wafer to the mother board relative to some marking provided on the mother board. The projection 17 can also be used as a key indicator with some mating projection on the module as shown. The wafer 16 includes a main body 18, formed in a preferred embodiment of thermoplastic material, such as nylon. The main body of the wafer is relatively thin, as shown in FIGURE 1, to minimize the overall mounting height of the assembled module and wafer on a mother board and to minimize the length of the circuit path between the components in the modules and the printed circuit paths on the mother board.

In the upper surface of the wafer body 18 a plurality of apertures 20 are provided in a pattern corresponding to the pattern of leads 14 of the module. As will be described hereinafter, the apertures 20 have a particular interior configuration which serve a number of different functions, including guiding the leads 14 into a proper position for full insertion, as well as holding the sockets of the wafer in a proper position to reduce distortion of the wafer. In each of the apertures 20 is mounted a socket contact member 22 projecting downwardly from the wafer body. The members 22 are, of course, in a pattern corresponding to the leads 14 and extend in a sense parallel to each other.

Beneath the wafer 16 there is shown a mother board 26, which includes a central aperture 28 and a plurality of socket apertures 30, arranged in an appropriate pattern to receive the socket members 22. The aperture 28 is positioned in the center of the pattern of apertures 30 and the wafer includes a projecting latch structure shown as 24, which fits into aperture 28 and latches the wafer onto the mother board. This feature will be described in greater detail relative to a further embodiment of the invention. The mother board 26 is made to carry appropriate circuit paths. Typically these paths may be formed by printed circuit techniques on the under side of the board 26. In use the wafer 16 is plugged into the mother board with the structure 24 latched thereto in a proper position relative to the positioning of the ends of the socket members for soldering or other termination techniques to the circuit paths on the bottom of the board. After this is accomplished the module may be plugged into or removed from the wafer to be effectively connected or disconnected into or from the circuit of use. Typically the board 26 might accommodate a dozen or so wafers with the circuit paths defining all interconnections between modules and there being provided suitable paths providing inputs and outputs to the mother board.

FIGURE 2 shows an alternative embodiment of the invention relative to an alternative module structure. The module shown as 32 is of a cylindrical configuration with a housing can 34 which is typically of a metallic construction containing therewithin an integrated circuit. Leads to the integrated circuit are carried through the can through insulating and sealing inserts to extend, as shown by numeral 36, outwardly and downwardly therefrom in a parallel relationship.

The wafer of the invention is shown as 38 in FIGURE 2 to include an integral body of insulating material including an upward projection 40 having somewhat conically shaped sidewall and from the base thereof an outwardly projecting wall portion 42, containing a series of apertures 50 disposed in a circular pattern corresponding to the pattern of leads 36 of the module 32. There is provided a projecting portion shown as 46 which can serve to orient the wafer in the manner discussed above. The apertures 50 are arranged in a circular pattern corresponding to the leads and have a configuration as generally shown in FIGURE 3 and as shown in detail in FIGURE 4. The wafer body includes an integral, downwardly projecting portion shown as 47 which terminates in a latch structure defined by a slot 48 and a beveled portion rounded as at 49 to engage the under side of the mother board and hold the wafer in position.

FIGURE 3 shows the wafer in position with the latch structure engaged. As can be seen from FIGURE 3, the under side of the wafer body includes a series of rounded projections or bumps shown as 43 and a projecting flange surrounding the body of the latch structure, such flange being shown as 45. The bumps 43 serve as a stand-off holding the body of the wafer off from the other surface of the board 26. This provides a space to allow defluxing of the upper surface of the board following soldering or other termination procedures. It is also contemplated that the bumps 43 may serve to bond the wafer to the board in the event there is a requirement of this type. By placing a small spot of adhesive such as epoxy glue on the tip of the bump the wafer may be bonded to the board. Thereafter, in the event it is necessary to remove the wafer from the board the bond can be quite easily broken by forcing a knife edge surface beneath the wafer to sever the bond spot or the bump material. If the wafer were bonded by adhesive applied to the flat under surface of the wafer, considerable difficulty would be encountered in removing the wafer from the board.

The projecting flange 45 also serves as a stand-off and additionally facilitates a modification of the wafer as shown in FIGURES 2 and 3, for use in those applications which require circuit paths on the top of the board 26 in lieu of or in addition to circuit paths on the bottom of the board. In such event the wafer latch structure is severed along the dotted line indicated in FIGURE 3, marked by the flange 45 and the board of use contains no aperture for the latch. The lower face of the flange 45 is then bonded to the top of the board by the use of a quick setting bonding agent applied to the face of the flange prior to inserting the wafer assembly into the board. It may contain some orienting structure projecting upwardly to engage the outside edges of the wafer in lieu of the aperture providing the latching function. In this way circuit paths can be made to extend between the socket members across a surface of the board which, in the other embodiment, is not present due to the aperture 28.

The contact of use for the wafer of the invention is shown as 62 in FIGURE 3 to include an outer shell 64, preferably of thin conductive material drawn to the configuration shown or stamped and formed to include a thin and malleable portion 66, which is folded inwardly in the manner indicated in FIGURES 3 and 4 to captivate the end flange portions of a contact spring shown as 68 held within 64. Reference may be had to U.S. Patent No. 3,286,671 granted Nov. 22, 1966, to G. A. Fuller for a teaching of a preferred contact spring construction and a suitable mounting structure. Other contact constructions are also contemplated.

As one aspect of the present invention, however, it is contemplated that the portion 66 of the contact socket will contain an interior bevel as indicated in FIGURE 3, which matches a beveled surface shown at 54, formed in the aperture 50 of the wafer. The aperture 50 of the wafer may be seen to be defined by a first, relatively straight portion 52, leading to the beveled portion 54 and which in turn leads to another straight portion shown as 58. Portion 58 may contain a series of projections shown as 56, which serve to receive and latch the socket in position within the aperture of the wafer. The aperture of the wafer further includes in the embodiment shown in FIGURE 4 a beveled portion 59 which serves as a stop, limiting insertion of the socket contact and fixing the position thereof relative to the wafer. Portion 59 leads to a straight cylindrical portion 60, which receives the main body of the shell 64 of the contact socket 62. As can be seen from FIGURES 3 and 4, the contact socket maximum diameter is defined in the upper flange portion. In accordance with one embodiment, the diameter of the aperture in the portion 58 is controlled to provide an interference fit with the contact socket member. Due to the positions of the beveled portion 59, and the projecting portions 56, loading of the material of the wafer is made to reside along the center line of the body of the wafer, as indicated in FIGURES 3 and 4. All stress caused by insertion of the socket members is thus concentrated along the center line to avoid warping of the body of the wafer. FIGURE *5a* shows schematically what may happen as a result of cumulative loading from the various socket members occurring in regions above the centerline of the wafer body. FIGURE *5b* shows what may happen due to a cumulative loading resulting from a positioning of socket members generally below the center line of the wafer. FIGURE *5c* shows a desired configuration of the wafer relatively free of distortion effected by the use of the invention. It is to be remembered that any preferred embodiment of the wafer material is of a thermoplastic nature having a resilience to receive the contacts in an interference fit.

In the one embodiment above-mentioned the diameter of portion 60 of the aperture 50 is controlled to provide a guiding fit so that no appreciable loading of the wafer material occurs in related regions thereof. The foregoing structure of the wafer and the contact also accommodates production tolerances wherein certain of the apertures may be slightly undersized or certain of the contacts may be slightly oversized to cause a resulting loading of the material. It is contemplated that in certain embodiments the dimensions of the contact member and of the aperture of the wafer may be specified to provide a sliding fit relative to the regions around portions 58 and 60, with variations from tolerances alone causing all loading of the wafer and with the structure described preventing such loading from effecting a distortion of the wafer. It is also contemplated that the apertures 50 may be axially displaced relative to each other to provide a balancing of stresses to neutralize distortion.

It is contemplated that the invention may be carried out in structures utilizing the different aspects thereof in response to different requirements of cost and use of materials. For example, certain thermosetting plastics are much more difficult to mold to a given tolerance than are others and it may be necessary to leave off the projections 56, relying solely upon the interference fit and the portion 59 to position the contact members properly. It may be that if the contact socket outer shell is a screw machine part tolerances can be controlled so that there is no need to try for an interference fit in the region of material surrounding 58 and positioning of the socket may be accomplished by the surface portion of the aperture shown as 59 and the use of projections like 56, the portions of 58 being specified to provide a guiding fit. In such event the other aspects of the invention may, of course, be incorporated to the end of achieving the advantages attributable thereto.

What is claimed is:

1. A device for providing a pluggable multiple termination of a component having a given array of multiple leads comprising a housing of insulating material including free-standing wafer portions which are sufficiently thin to provide a low profile, a plurality of apertures extending through said wafer portions and arranged in said given array, a plurality of spring contact elements mounted within said apertures, said contact elements each including a tubular portion appreciably greater in length than the length of said apertures so as to extend down beneath said housing to be plugged into a circuit board and terminated thereto, each contact element further including a head portion fitted down within an associated aperture, each said head portion and each associated aperture having a geometry so that an interference fit is provided therebetween substantially only in the center plane of the wafer portions whereby to neutralize forces developed by the mounting of the array of contact elements in its tendency to bow said wafer portions and misalign the contact tubular portions.

2. The device of claim 1 wherein said housing is of a length substantially greater than the width thereof with the said apertures being arranged in parallel rows.

3. The device of claim 1 wherein said housing is substantially circular in configuration with the said wafer portions extending around the periphery thereof.

4. The device of claim 1 wherein said housing includes an integral projecting latch means located substantially at the center of the bottom surface thereof and adapted to be plugged into a mating aperture in a circuit board.

5. The combination comprising a printed circuit board having conductive paths on at least a lower surface thereof and a plurality of apertures arranged in a given array leading to said circuit paths, a further aperture located substantially in the center of said given array of apertures and adapted to receive a latch mechanism on a contact mounting header, a component adapted to be terminated to the circuit paths of said circuit board including a plurality of leads arranged in said given array, a header including a housing of thermoplastic material having peripherial portions which are thin and stiffly flexible, a series of apertures in said peripherial portions arranged in said given array, the interiors of said apertures including a configuration to receive and support a spring contact element therein, a series of spring contact elements adapted to receive the leads of said component and each including a head portion dimensioned to engage in an interference fit the interior of an associated aperture substantially in the center plane of said peripherial portions, said contact elements further including a tubular portion extending from said head portion beneath the surface of said peripherial portions to be plugged into the apertures of said board and extend therethrough to be terminated to the conductive paths on the lower surface thereof, the said header further including an integral portion of insulating material forming a latch mechanism extending from the lower surface thereof and substantially centrally located relative to said contact elements, the said latch mechanism being inserted within the further aperture of the board to latch said header to said board while said contact elements are being terminated to said conductive paths of said board.

References Cited

UNITED STATES PATENTS

| | | | |
|---|---|---|---|
| 2,454,326 | 11/1948 | Makenny. | |
| 2,475,243 | 7/1949 | Irrgang | 339—196 XR |
| 2,560,212 | 7/1951 | Byrd et al. | 339—93 |
| 2,969,517 | 1/1961 | Gluck. | |
| 3,089,062 | 5/1963 | Schulz | 317—101 |
| 3,105,729 | 10/1963 | Rosenthal et al. | 339—18 |
| 3,125,395 | 3/1964 | Swanson. | |
| 3,141,717 | 7/1964 | Olsson et al. | |
| 3,286,671 | 11/1966 | Fuller | 339—256 XR |
| 3,383,648 | 5/1968 | Tems. | |

MARVIN A. CHAMPION, Primary Examiner

PATRICK A. CLIFFORD, Assistant Examiner

U.S. Cl. X.R.

339—217